(12) United States Patent
Wachtmann et al.

(10) Patent No.: US 6,964,894 B2
(45) Date of Patent: Nov. 15, 2005

(54) APPARATUS AND METHOD OF FORMING A DEVICE LAYER

(75) Inventors: Bruce K. Wachtmann, Concord, MA (US); Michael W. Judy, Wakefield, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/601,980

(22) Filed: Jun. 23, 2003

(65) Prior Publication Data

US 2004/0256689 A1  Dec. 23, 2004

(51) Int. Cl.[7] .......................................... H01L 21/8238
(52) U.S. Cl. ...................... 438/207; 438/218; 438/294; 438/427; 257/446; 257/506
(58) Field of Search ................................ 438/639, 400, 438/300, 48, 207, 294, 427, 218, 219; 257/729, 257/747, 773, 782, 783, 446, 506, 508, 414, 257/704; 361/757, 758, 807

(56) References Cited

U.S. PATENT DOCUMENTS

| | | | |
|---|---|---|---|
| 5,216,490 A | 6/1993 | Greiff et al. | |
| 5,343,064 A | 8/1994 | Spangler et al. | |
| 6,021,675 A | 2/2000 | Seefeldt et al. | |
| 6,240,782 B1 | 6/2001 | Kato et al. | 73/514.32 |
| 6,268,232 B1 | 7/2001 | Skapa et al. | 438/51 |
| 2002/0016095 A1 | 2/2002 | Fork et al. | 439/81 |
| 2002/0117728 A1 * | 8/2002 | Brosnihan et al. | 257/446 |
| 2004/0104444 A1 * | 6/2004 | Wachtmann et al. | 257/414 |

FOREIGN PATENT DOCUMENTS

| | | |
|---|---|---|
| EP | 0 834 759 A2 | 8/1998 |
| WO | WO 02/12116 A2 | 2/2002 |
| WO | WO02/12116 A2 | 2/2002 |

OTHER PUBLICATIONS

Timothy J. Brosnihan et al., Embedded Interconnect and Electrical Isolation for High-Aspect-Ratio, SIO Inertial Instruments; Jun. 16-19, 1997; pp. 637-640.
Wachmann et al., U.S. Appl. No. 10/308,688, filed Dec. 3, 2002, entitled MEMS Device with Alternative Electrical Connections.
International Searching Authority, International Search Report, dated Oct. 7, 2004.

* cited by examiner

Primary Examiner—David Nelms
Assistant Examiner—Long Tran
(74) Attorney, Agent, or Firm—Bromberg & Sunstein LLP

(57) ABSTRACT

A method of forming a MEMS device produces a device layer wafer having a pre-formed conductive pathway before coupling it with a handle wafer. To that end, the method produces the noted device layer wafer by 1) providing a material layer, 2) coupling a conductor to the material layer, and 3) forming at least two conductive paths through at least a portion of the material layer to the conductor. The method then provides the noted handle wafer, and couples the device layer wafer to the handle wafer. The wafers are coupled so that the conductor is contained between the material layer and the handle wafer.

15 Claims, 11 Drawing Sheets

APPARATUS AND METHOD OF FORMING A DEVICE LAYER

RELATED APPLICATION

This patent application is related to co-pending U.S. patent application Ser. No. 10/308,688, filed Dec. 3, 2002 and being entitled, "MEMS DEVICE WITH ALTERNATIVE ELECTRICAL CONNECTIONS," the disclosure of which is incorporated herein, in its entirety, by reference.

FIELD OF THE INVENTION

The invention generally relates microelectromechanical systems and, more particularly, the invention relates to electrical connections on microelectromechanical systems.

BACKGROUND OF THE INVENTION

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, such MEMS devices typically have a structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

The electronics and suspended structure often are formed (by conventional etching processes) from the top layer of a multi-layered wafer. Problems arise during manufacture, however, when one portion of the top layer is electrically isolated from the remainder of the top layer, and/or not readily accessible to the edges of the device. In particular, from a design and manufacturing perspective, it is difficult to electrically connect such portion (referred to as an "island" or "isolated portion") to other portions of the top layer. One solution to this problem is to snake an insulated line across the tortuous path leading to the isolated portion. This process generally is cumbersome, however, consequently increasing production costs.

SUMMARY OF THE INVENTION

In accordance with one aspect of the invention, a method of forming a MEMS device produces a device layer wafer having a pre-formed conductive pathway before coupling it with a handle wafer. To that end, the method produces the noted device layer wafer by 1) providing a material layer, 2) coupling a conductor to the material layer, and 3) forming at least one conductive path through at least a portion of the material layer to the conductor. The method then provides the noted handle wafer, and couples the device layer wafer to the handle wafer. The wafers are coupled so that the conductor is contained between the material layer and the handle wafer.

In some embodiments, the material layer has an exposed top surface, and the at least one conductive path extends to the exposed top surface. A portion of the material layer may be removed to substantially expose the conductive path. Moreover, the material layer may have an exposed top surface. In fact, the exposed top surface may be oxidized to optically distinguish the material layer from the conductive path.

The method also may apply an insulator between the material layer and the conductor. For example, the insulator may couple the conductor to the material layer. In some embodiments, the conductor is formed from a first semiconductor material and the material layer is formed from a second semiconductor material. In other embodiments, the at least one conductive path is an anchor.

In accordance with another aspect of the invention, a method of forming a device layer wafer of a MEMS device provides a material layer having a top surface, and then forms a conductive pathway through at least a portion of the material layer. The conductive pathway has at least one end substantially at the top surface. The method then oxidizes the top surface of the material layer to optically distinguish the ends of the conductive pathway from the material layer.

In some embodiments, the method removes a portion of the material layer to form the top surface. Moreover, the conductive pathway may be formed by coupling a conductor to the material layer, and forming at least one conductive path through at least a portion of the material layer to the conductor. The at least one conductive path and conductor together form (i.e., comprise) the conductive pathway.

Among other things, oxidizing the top surface of the material layer may cause the path end to extend outwardly from the top surface of the material layer. Oxidizing the top surface of the material layer also may cause the end to have a first color, and the top surface of the material layer to have a second color. In illustrative embodiments, the first and second colors are different. To those ends, the material layer may be formed from a first material while the conductive pathway is formed from a second, different material.

In accordance with still another aspect of the invention, an uncoupled device wafer capable of coupling with a handle wafer has a material layer and a conductor coupled to the material layer. The uncoupled device wafer also has at least one conductive path formed through at least a portion of the material layer to the conductor.

The conductive path may terminate within the material layer, or at the top surface of the material layer. The uncoupled device wafer also may have an insulator layer coupling the conductor to the material layer. It may have another insulating layer, where the conductor is contained between the insulator layer and the material layer.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, the top wafer of a three layer MEMS device (e.g., an insulator layer between two silicon layers) is formed with a conductive pathway leading to an internal conductor before it is coupled with a bottom wafer. The internal conductor can electrically connect otherwise electrically isolated portions of the MEMS device. Details of illustrative embodiments are discussed below.

Figure 1:
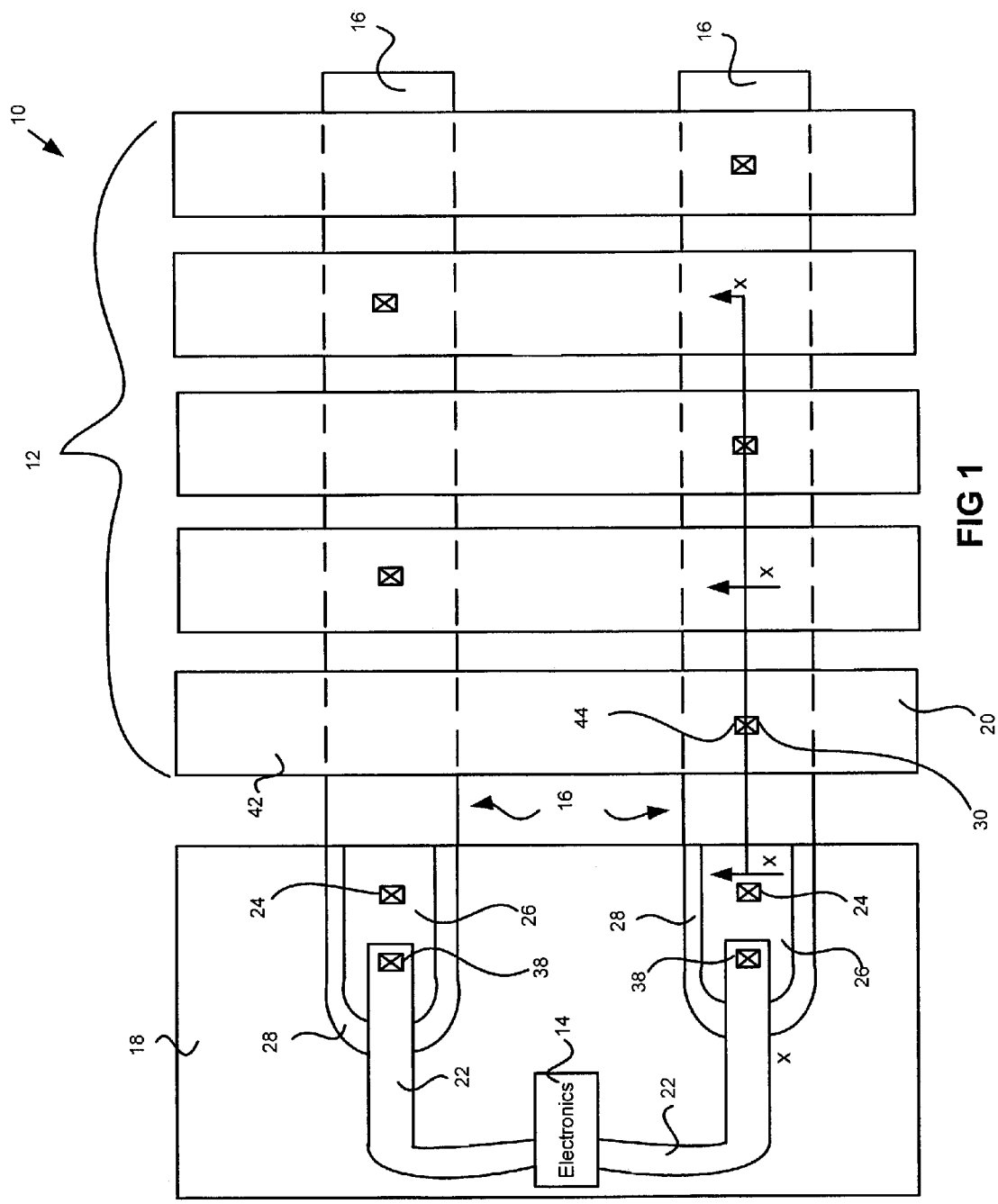
FIG. 1 schematically shows a top view of a MEMS device that may be configured and produced in accordance with illustrative embodiments of the invention.

FIG. 1 schematically shows a MEMS device 10 that may be configured in accordance with various embodiments of the invention. In illustrative embodiments, the MEMS device 10 is implemented as a gyroscope. Accordingly, for illustrative purposes, various embodiments are discussed herein as a MEMS gyroscope. The MEMS device 10 thus is identified in this description and in the drawings as gyroscope 10 or MEMS device 10. It should be noted, however, that discussion of various embodiments as a gyroscope is exemplary only and thus, not intended to limit all embodiments of the invention. Accordingly, some embodiments may apply to other types of MEMS devices, such as optical switching devices and accelerometers.

In illustrative embodiments, the MEMS device 10 includes both mechanical structure to sense angular rotation, and corresponding electronics to process such sensed rotation. This entire functionality is located on a single die. Some embodiments, however, may apply to MEMS devices having the structure only, or the electronics only. The structure and electronics (both shown schematically in the drawings) illustratively are formed on a silicon-on-insulator ("SOI") wafer, which has an insulator layer (e.g., an oxide) between a pair of silicon layers.

The mechanical structure may include one or more vibrating masses suspended above a silicon substrate by a plurality of flexures (not shown). The structure also may include a comb drive and sensing apparatus to both drive the vibrating masses and sense their motion. In a corresponding manner, the electronics may include, among other things, the driving and sensing electronics that couple with the comb drive and sensing apparatus, and signal transmission circuitry. Wires electrically connect the accompanying electronics with pins on an exterior package (not shown). For simplicity, the electronics are shown schematically at reference number 14, while the mechanical structure is shown schematically at reference number 12.

Exemplary MEMS gyroscopes are discussed in greater detail in co-pending provisional and non-provisional U.S. patent applications identified by Ser. Nos. 60/364,322, 60/354,610, 10/360,987, and 10/234,215, each of which are assigned to Analog Devices, Inc. of Norwood, Mass. The disclosures of these noted provisional and non-provisional patent applications are incorporated herein, in their entireties, by reference.

In accordance with illustrative embodiments of the invention, the MEMS device 10 includes an internal conductive element (identified by reference number 16) that electrically connects a primary portion 18 of the MEMS device 10 with an electrically isolated portion 20 of the MEMS device 10. This connection consequently electrically connects the isolated portion 20 with the electronics 14.

More specifically, the primary portion 18 is electrically connected to 1) the electronics 14 via a metal lead 22, and 2) the internal conductive element 16 via a first conductive path 24 (e.g., a staple). The first conductive path 24 is isolated from the remainder of the primary portion 18 within an interface area 26 that is surrounded by a nitride isolation trench 28. The conductive element 16 extends within the MEMS device 10 underneath the prior noted mechanical structure 12. At least a portion of such mechanical structure 12 is the noted isolated portion 20, which otherwise is electrically isolated from the primary portion 18. In other words, absent the internal conductive element 16, the isolated portion 20 is electrically isolated from the primary portion 18. Accordingly, as discussed below in greater detail, the isolated portion 20 includes a set of second conductive paths 30 (e.g., an anchor and/or a staple) that contacts the internal conductive element 16, thus electrically connecting the isolated portion(s) 20 to the primary portion 18.

Figure 2:
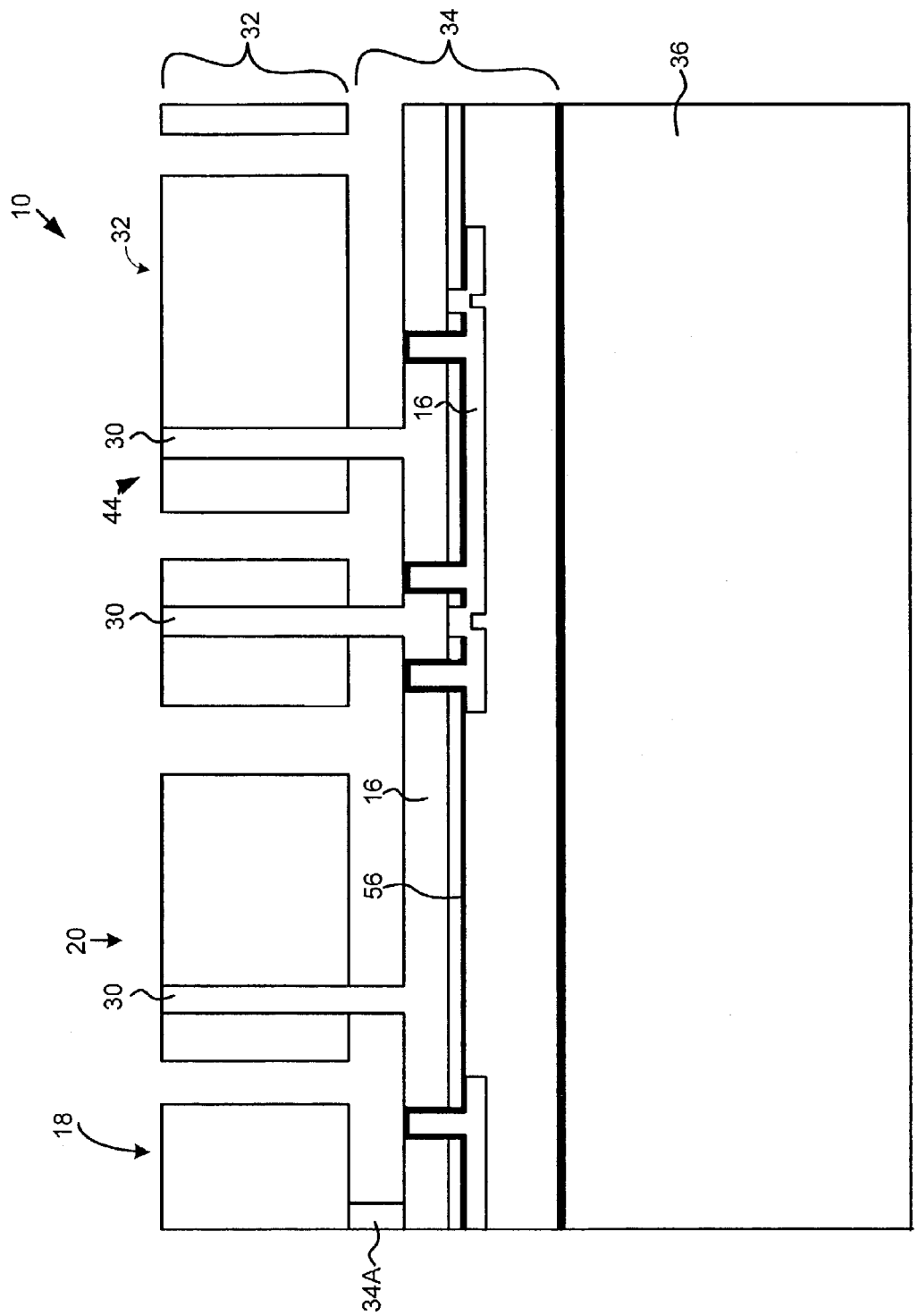
FIG. 2 schematically shows a cross-sectional view (along line X—X) of the completed MEMS device shown in FIG. 1. This figure also illustrates steps 308 and 310 of FIG. 3.

Additional details of the MEMS device 10 are shown in its cross-sectional view shown in FIG. 2. Specifically, FIG. 2 schematically shows a cross-sectional view of the MEMS device 10 of FIG. 1 along line X—X. As shown, the MEMS device 10 has three layers; namely, atop layer 32 having the electronics 14 and mechanical structure 12, an insulator layer 34 having the internal conductive element 16, and a bottom layer 36 acting as a support substrate. The top layer 32 often is referred to herein as the "device layer 32" while the bottom layer 36 often is referred to as the "handle layer 36."

The top and bottom layers 32 and 36 may be manufactured from a semiconductor (e.g., polysilicon, single crystal silicon, or amorphous silicon), while the insulator layer 34 may be manufactured from any insulator suitable for the required purposes, such as an oxide. As known by those in the art, conventional manufacturing processes (discussed below) remove and etch portions of the different layers to form the final MEMS device 10. Details of this process are discussed below with reference to FIGS. 3–11.

Among other portions, the top layer 32 is considered to have the above noted primary and isolated portions 18 and 20. The primary portion 18 includes a contact 38 (shown in FIG. 1—not in FIG. 2) for receiving an electrical signal from the electronics 14 via the metal lead 22 (shown in FIG. 1—not in FIG. 2), and the noted first conductive path 24 (shown in FIG. 1—not in FIG. 2) extending to the conductive element 16 in the insulator layer 34. As discussed in greater detail below, the first conductive path 24 may be a conductor or semi-conductor material, such a doped polysilicon.

The isolated portion 20 includes movable structure 12 (e.g., fingers of a comb drive) and the second conductive path 30 extending to the conductive element 16 in the insulator layer 34. In a manner similar to the first conductive path 24 (extending through the primary portion 18), the second conductive path 30 also is manufactured from a conductive or semiconductor material, such as polysilicon. Consequently, the first conductive path 24, conductive element 16, and the second conductive path 30 together form an electrical pathway to electrically connect the primary portion 18 with the isolated portion 20.

The isolated portion 20 thus may communicate with the electronics 14 via the metal lead 22, contact 38, and electrical pathway. Among other things, such signals may be control signals to actuate the comb drive, or data signals having sensed capacitance information. The conductive element 16 thus effectively electrically connects the otherwise electrically isolated portion 20 of the top layer 32 with the primary portion 18. In various embodiments, the isolated portion 20 is bounded on all sides by other portions of the top surface (i.e., it effectively forms an island on the top layer 32). In such case, the isolated portion 20 is not readily accessible to the edges of the MEMS device 10. Using the conductive element 16 within the insulator layer 34 thus provides a more effective means for electrically connecting the isolated portion 20 with the electronics 14.

Because it has movable structure 12, the isolated portion 20 may have both a movable portion 42 and a non-movable portion 44. In illustrative embodiments, the second conductive path 30 extends through the non-movable portion 44 of the isolated portion 20. Consequently, the second conductive path 30 performs the dual functions of an anchor and a conductive path. In other embodiments, the conductive path does not perform the function of an anchor.

Figure 3:
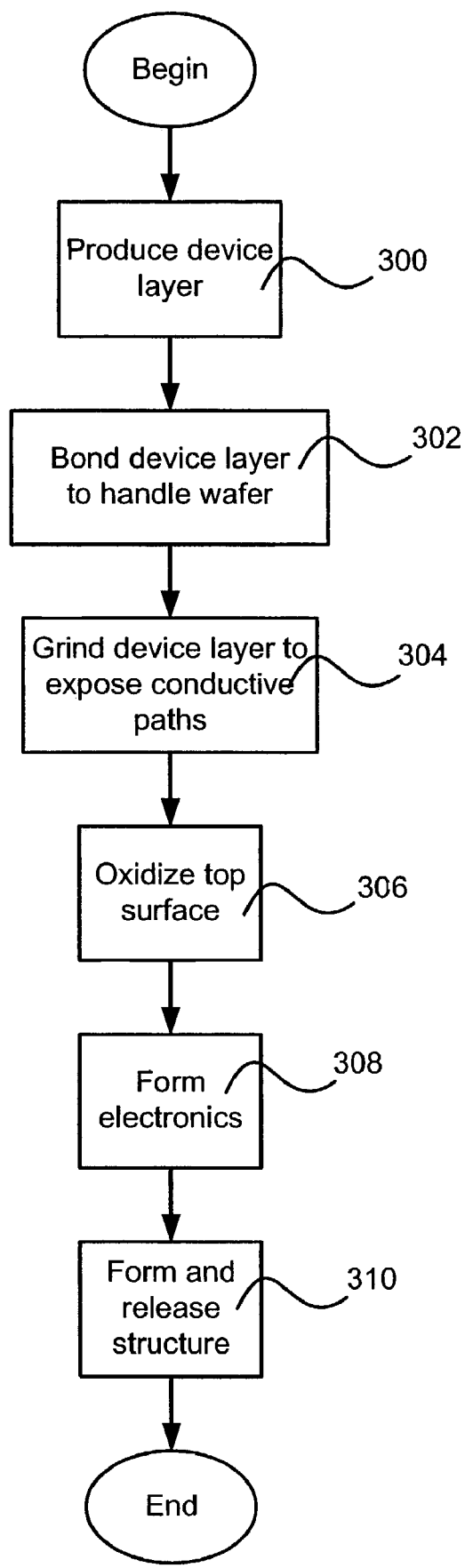
FIG. 3 shows an exemplary method of forming the MEMS device shown in FIGS. 1 and 2 in accordance with illustrative embodiments of the invention.
Figure 4:
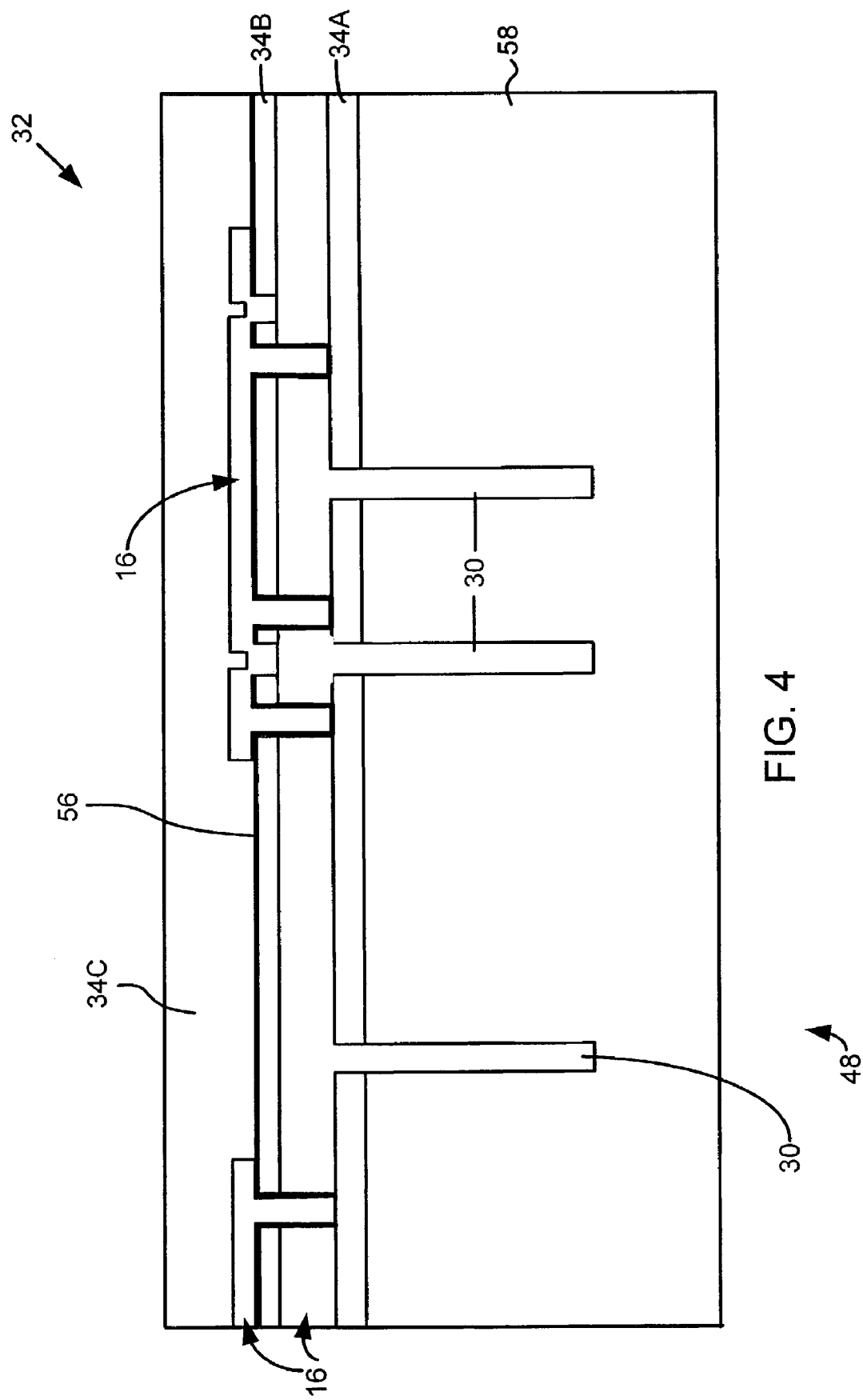
FIG. 4 schematically shows a cross-sectional view of an unattached device layer wafer (before it is mounted to a handle wafer) produced in accordance with illustrative embodiments. This figure illustrates step 300 of FIG. 3, and steps 716 and 718 of FIG. 7.

FIG. 3 shows an exemplary method of forming the MEMS device 10 shown in FIGS. 1 and 2 in accordance with illustrative embodiments of the invention. The method begins at step 300, in which the device layer 32 is produced as shown in FIG. 4. This process is described in detail below with reference to FIGS. 4 and 7–11. As shown in FIG. 4 and discussed above, the device layer 32 is formed so that the conductive element 16 electrically connects the primary portion 18 of the MEMS device 10 with the isolated portion 20 of the MEMS device 10. The device layer 32 also is formed so that it has a planarized insulator layer on one side 34C, and an opposed silicon surface 48.

The device layer 32 then is bonded to the handle wafer in accordance with conventional wafer-to-wafer bonding processes (step 302). In illustrative embodiments, the handle wafer 36 also has an insulator layer 46B that mates with the planarized oxide layer 34C (on the device layer 32) to form the single insulator layer 34. The resultant three layer structure thus forms the basis for a silicon-on-insulator MEMS device.

Figure 5:
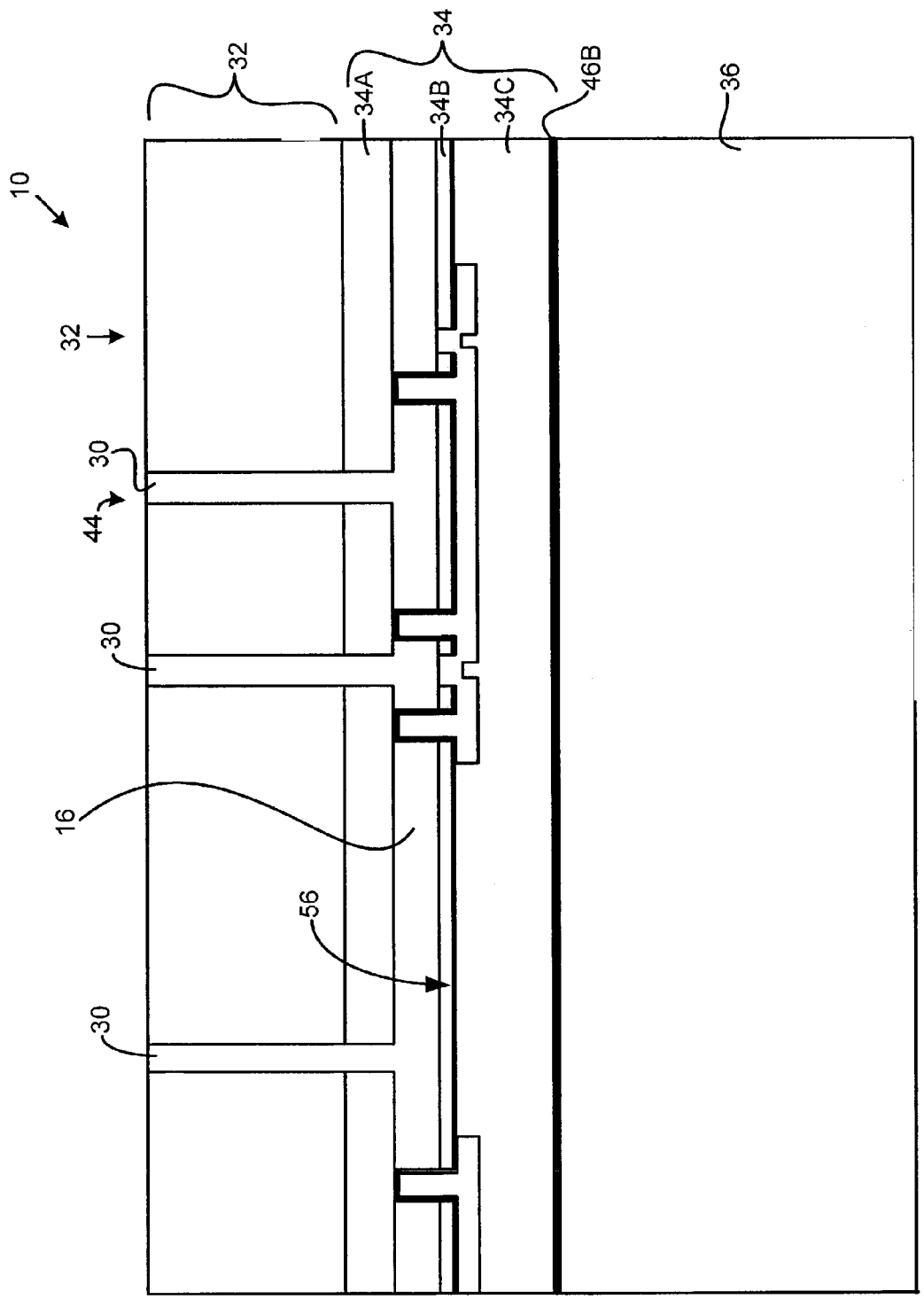
FIG. 5 schematically shows a cross-sectional view of an illustrative precursor to a MEMS device (before the structure is released, in this case) after it is processed by steps 302–304 of FIG. 3.

The process then continues to step 304, in which the top surface of the device layer 32 is ground down (i.e., polished) to a prespecified level. In illustrative embodiments, as shown in FIG. 5, the top surface is ground down to expose the ends of the various conductive paths 30. In other words, the top surface is ground down to a level that causes the ends of the conductive paths 24 and 30 to be substantially flush with the top surface. In alternative embodiments, the top surface can be ground down in this matter before the device layer 32 is bonded to the handle layer 36.

Figure 6:
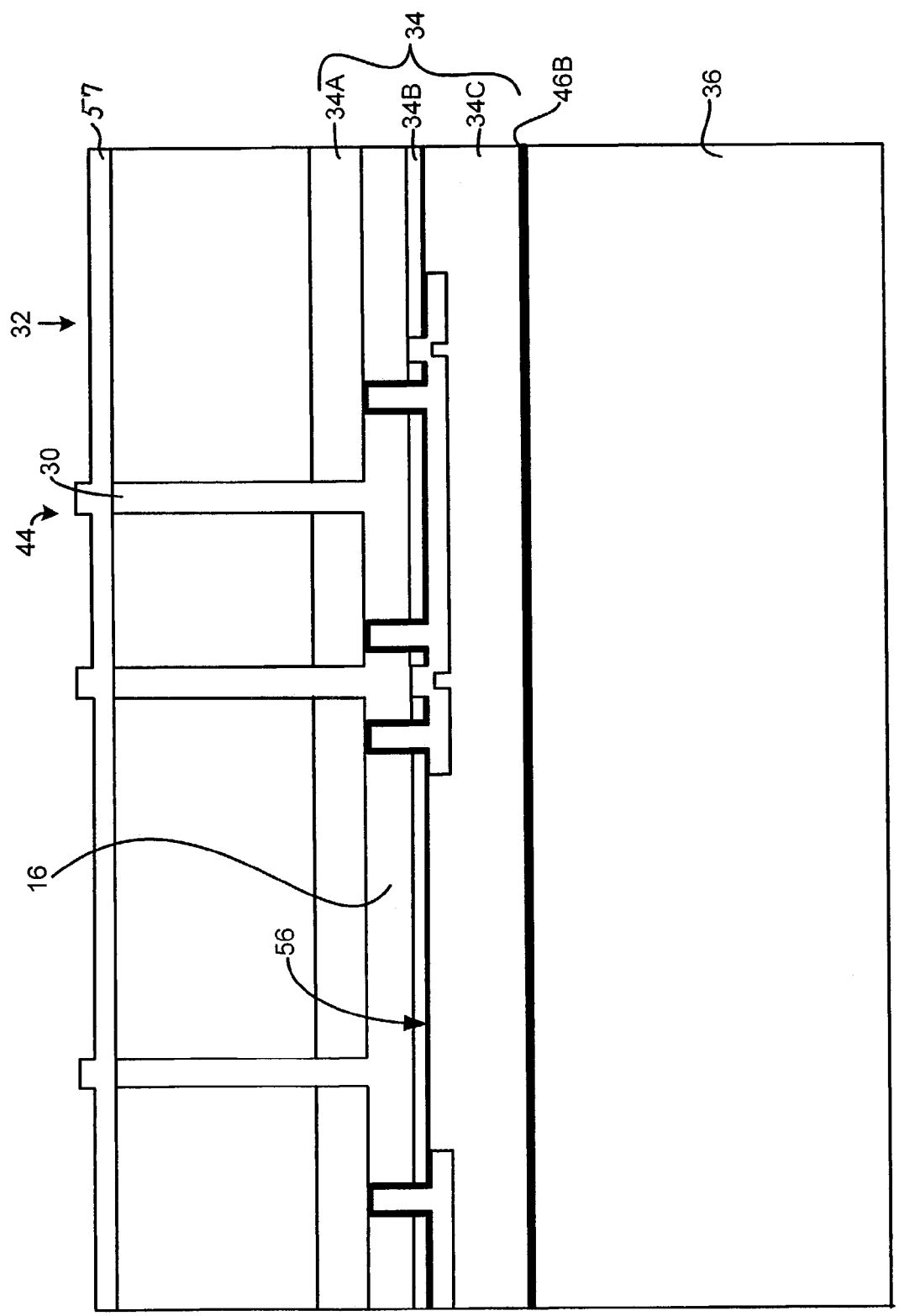
FIG. 6 schematically shows a cross-sectional view of the precursor to a MEMS device shown in FIG. 5 after it is processed by step 306 of FIG. 3.

This grinding process thus permits the conductive paths 24 and 30 to be accessible from the top surface. Further processing, however, can enhance their accessibility. To that end, at step 306, the top surface and exposed ends of the conductive paths 24 and 30 are oxidized in a conventional manner. More specifically, in illustrative embodiments, the conductive paths 24 and 30 are produced from a different material than that of the remainder of the device layer 32. For example, the device layer 32 may be formed from a single crystal silicon, while the conductive paths 24 and 30 may be produced from polysilicon. Accordingly, the conductive paths 24 and 30 oxidize at a different rate than that of the remainder of the top surface. The relative oxidization rates thus can be set by selecting the appropriate materials. Consequently, as shown in FIG. 6, the conductive paths 24 and 30 extend slightly outwardly from the top surface of the device layer 32.

Those skilled in the art understand that manufacturing equipment used to produce MEMS devices commonly employ optical recognition techniques. For example, a manufacturing machine may be set to first locate protrusions extending above the top surface of the device layer 32, and then make the appropriate connections to those protrusions. Accordingly, oxidizing the top surface ensures that the conductive paths 24 and 30 are optically distinguishable from the remainder of the top surface of the device layer 32.

In alternative embodiments, the top surface of the device layer 32 may not be ground down so that the conductive paths 24 and 30 are substantially flush. Accordingly, in such embodiments, other means may be employed to expose the conductive paths 24 and 30 to the top surface. For example, the top surface may be oxidized to a point that exposes them.

Moreover, because they oxidize at different rates, the oxides (e.g., see reference number 57 of FIG. 6) that grow over the different materials have different colors. For example, polysilicon typically turns a shade of blue when it oxidizes, while single crystal silicon typically turns a shade of brown for a certain oxidization process. Accordingly, optical recognition equipment can locate the conductive paths 24 and 30 merely by locating color differences in the top surface. Again, as noted above, different colors, can be produced based upon the materials selected. Either or both optical distinguishing processes (i.e., changing the height of the optical paths and/or creating the color differences) can be used to accomplish the same result.

The electronics 14 then may be formed on the device layer 32 in accordance with conventional processes (step 308). The process then continues to step 310, in which the mechanical structure 12 (e.g., beams) are etched from the top layer 32 (see FIG. 2). This step thus produces a space between the different structural components, thus causing discontinuities in the device layer 32. After it is formed, the structure 12 is released by removing selected portions of the insulator layer 34. In illustrative embodiments, an acid is used to remove the selected portions of the insulator layer 34. This step thus permits selected portions of the structure 12 to be suspended above the handle layer 36, 20 consequently completing the process. Although the MEMS device is essentially produced at this point, additional post-processing steps can be performed (e.g., testing, addition additional features, etc . . . ).

Figure 7:
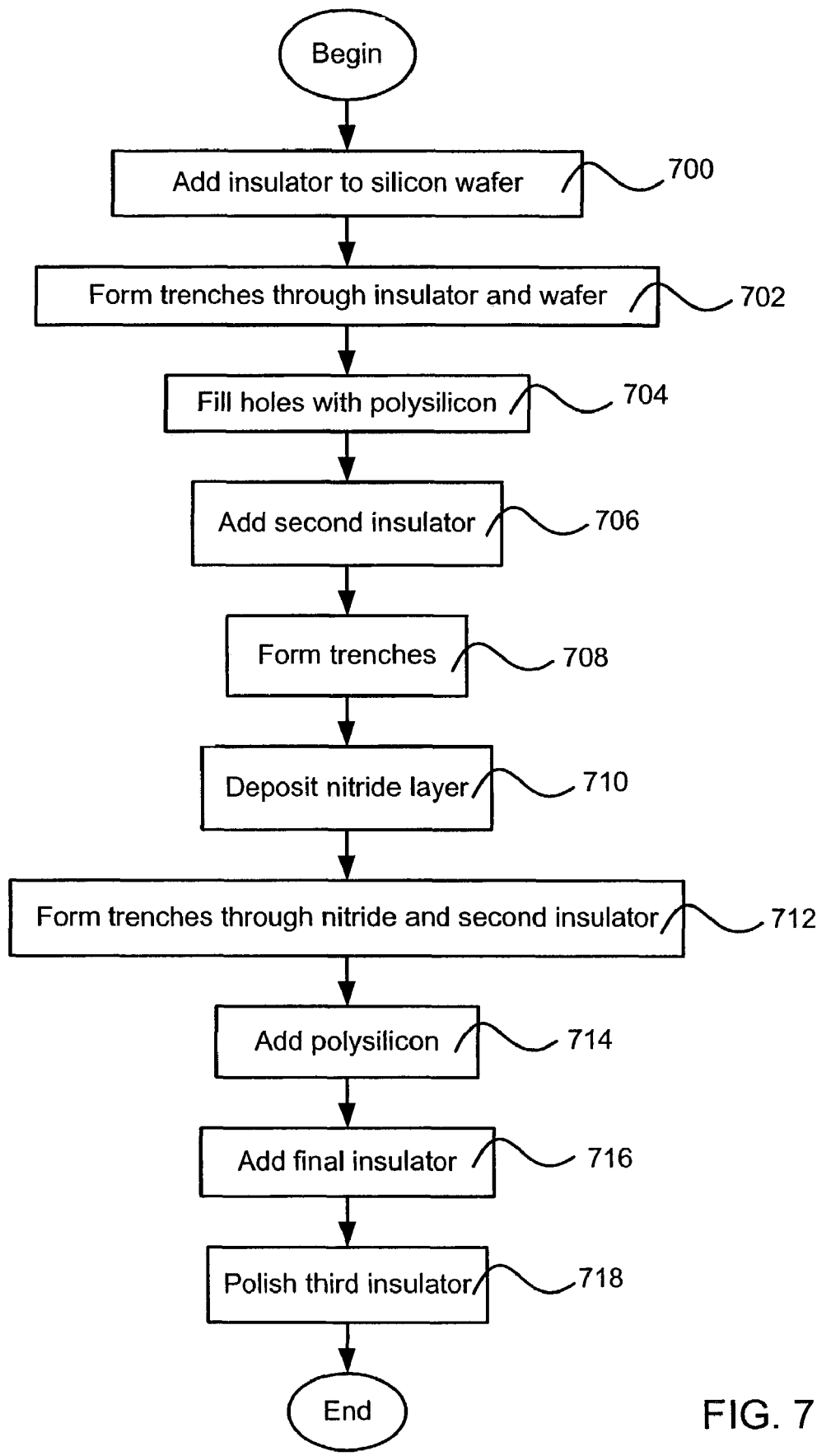
FIG. 7 shows an exemplary method of forming the device layer (e.g., shown in FIG. 4) in accordance with illustrative embodiments of the invention. This figure provides more detail about step 300 of FIG. 3.

FIG. 7 shows an exemplary method of forming the device layer 32 (shown in FIG. 4) in accordance with illustrative embodiments of the invention. As noted above, this figure provides more detail about step 300 of FIG. 3. The process begins at step 700 by depositing an insulator 34A onto the top surface of a silicon wafer 58. As noted above, the silicon wafer 58 may be a single crystal silicon wafer, while the insulator may be an oxide.

Figure 8:
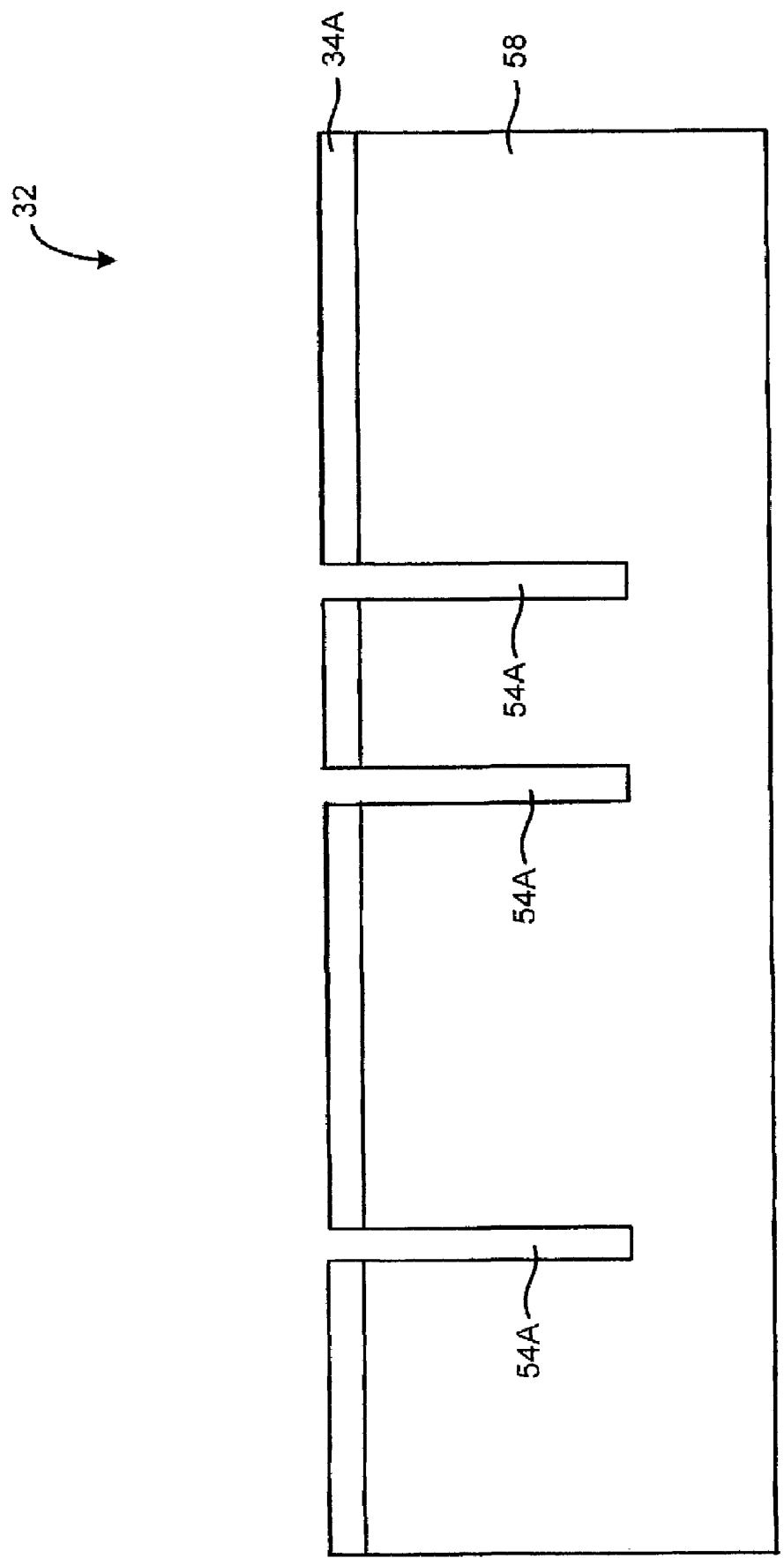
FIG. 8 schematically shows a cross-sectional view of the device layer after it is processed by steps 700 and 702 of FIG. 7.

The process continues to step 702, in which a plurality of holes/trenches 54A are formed through both the insulator 34A and the silicon wafer 58 (see, for example, FIG. 8). Conventional processing techniques, such as photolithographic processes using photo-resist layers may be used. In illustrative embodiments, the trenches 54A are formed in two separate etches—namely, one through the insulator 34A and another into the silicon wafer 58.

Figure 9:
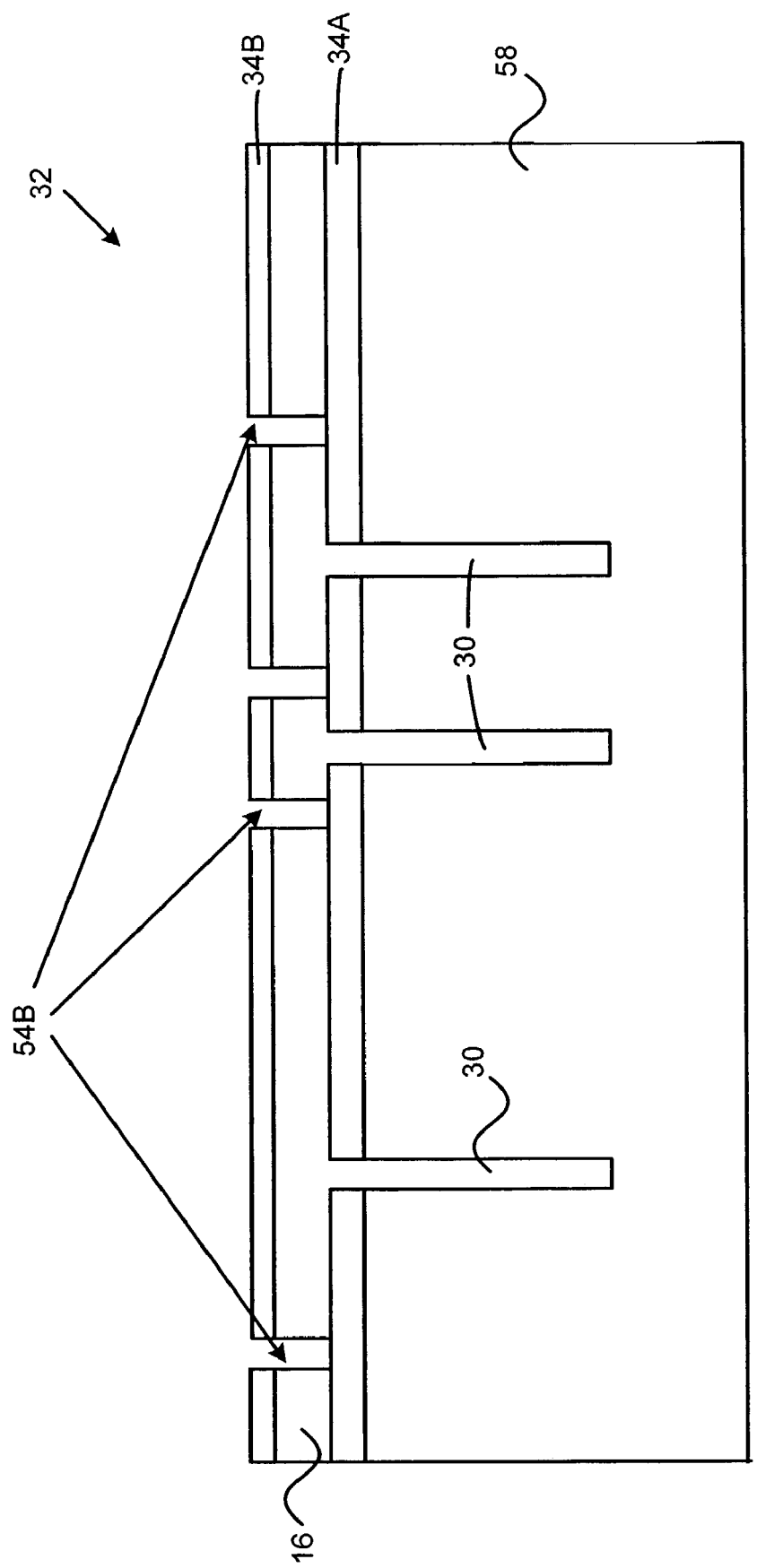
FIG. 9 schematically shows a cross-sectional view of the device layer after it is processed by steps 704–708 of FIG. 7.

After they are formed, the trenches 54A are filled with a conductive material that eventually forms some of the noted conductive paths 24 and 30 and conductive element 16 (step 704). To that end, as shown in FIG. 9, illustrative embodiments fill the trenches 54A with polysilicon. Additional polysilicon also is deposited on the top surface of the insulator 34A to form a conductive pathway between the filled trenches 54A. The second pathway then may be patterned in any manner required for the given application. A second insulator layer 34B subsequently may be added above the patterned polysilicon (step 706). Illustrative embodiments add this second insulator layer 34B to reduce capacitance problems between different polysilicon layers applied to the device layer 32.

The process then continues to step 708, in which trenches 54B are etched through the second insulator layer 34B and polysilicon layers (also see FIG. 9). Again, in a manner similar to the above noted etch, illustrative embodiments etch these trenches 54B in two separate etches. A liner 56 layer then may be added (e.g., from nitride) over the top of the current structure (step 710, FIG. 10). Illustrative embodiments add this liner 56 to both 1) insulate different conductive layers, and 2) protect portions of lower layers from acid applied to the device layer 32 during a later release step.

Figure 10:
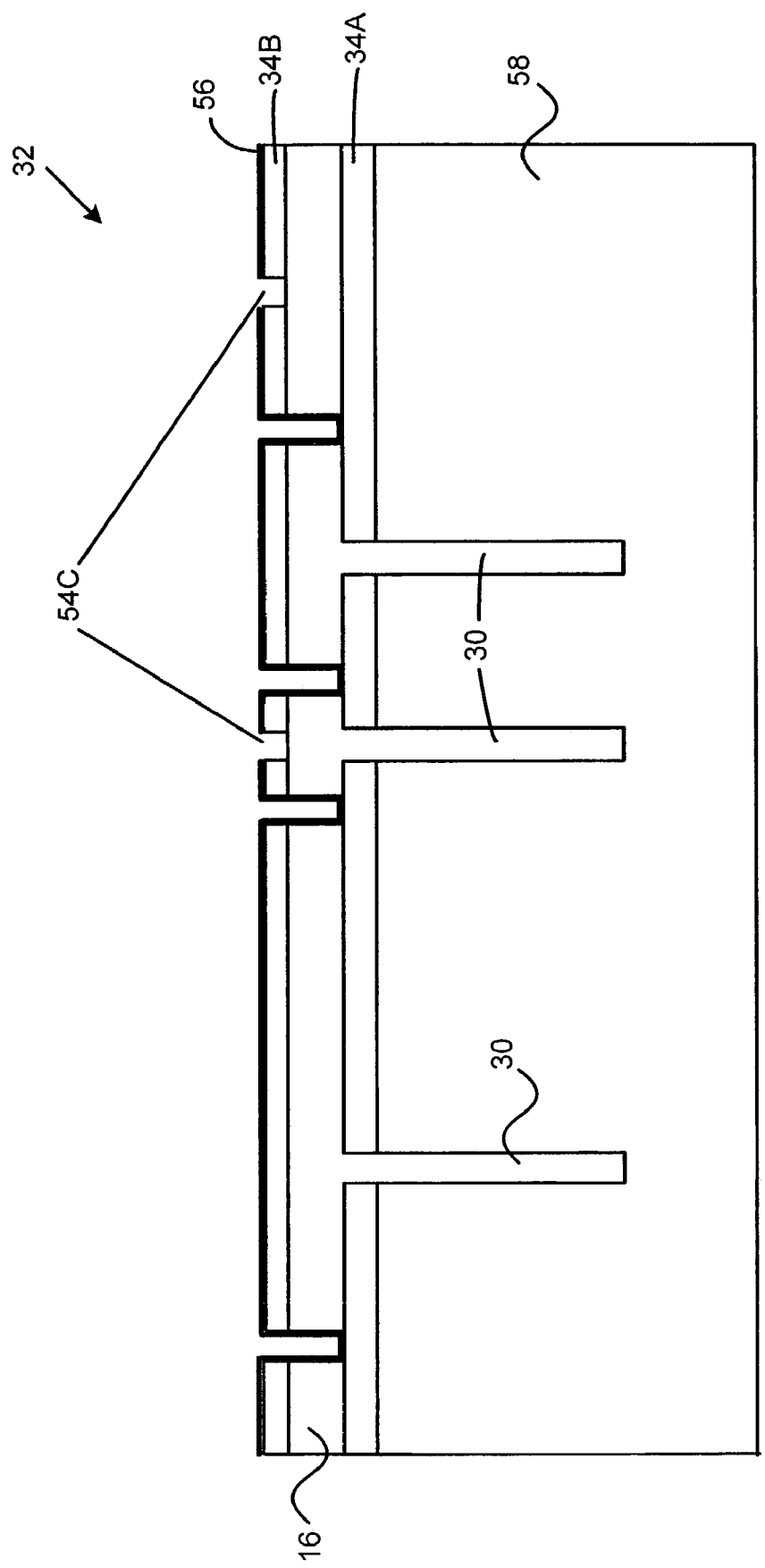
FIG. 10 schematically shows a cross-sectional view of the device layer after it is processed by steps 710–712 of FIG. 7.
Figure 11:
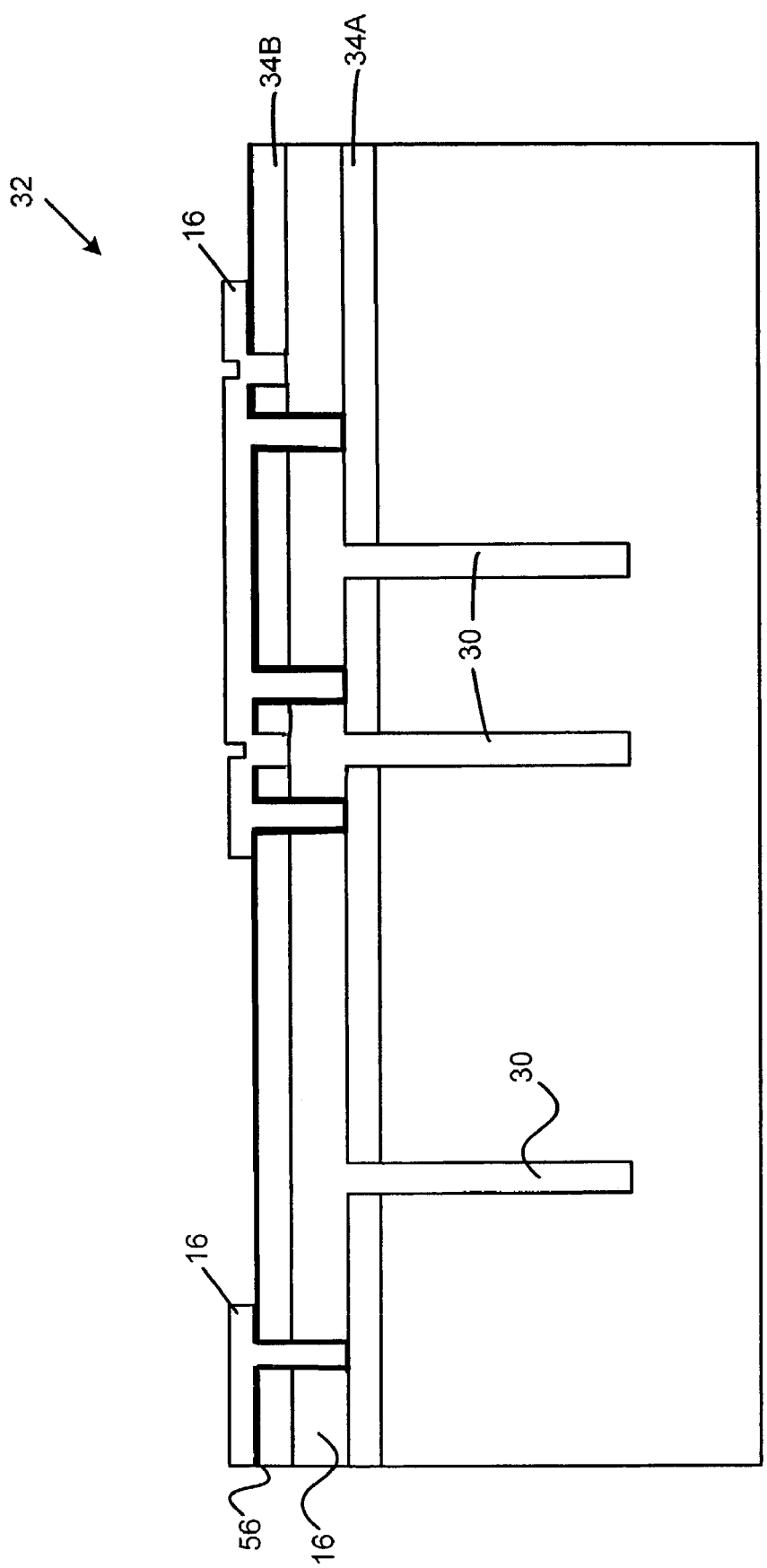
FIG. 11 schematically shows a cross-sectional view of the device layer after it is processed by step 714 of FIG. 7.

As shown in FIG. 10, illustrative embodiments then etch trenches 54C through the liner 56 and the second insulator layer 34B (step 712) in one etch. These trenches 54C terminate at the polysilicon immediately deposited below. Accordingly, as shown in FIG. 11, polysilicon is added to those trenches 54C and patterned across the top of the nitride liner 56 to form additional conductors 16 and means for connecting them together (step 714). The process of adding oxide and polysilicon layers can be repeated on different locations (i.e., either or both longitudinally and latitudinally) of the device layer 32.

After all internal conductive paths and conductive elements are formed, a final insulator layer 34C is deposited to the top of the overall structure as shown in FIG. 4 (step 716). In illustrative embodiments, the final insulator layer 34C is a tetraethylorthosilicate oxide (also known as a TEOS oxide) and is relatively thick compared to the underlying insulator layers. The process then concludes at step 718, in which the top surface of the final insulator layer 34C is polished to be substantially smooth, thus facilitating a subsequent bond with the corresponding insulator 46B on the handle wafer.

It should be noted that the MEMS device 10 may be produced with a plurality of conductive elements to electrically connect a number of different portions of the device layer 32. In fact, in some embodiments, the conductive element 16 may electrically couple two portions that are accessible to the edges of the MEMS device 10. Moreover, the shape and size of the conductive element 16 is selected based upon the specific requirements of the MEMS device 10. In yet other embodiments, the conductive element 16 may electrically connect more than two portions of the MEMS device 10.

Discussion of an SOI based MEMS device is exemplary and thus, not intended to limit all embodiments of the invention. For example, in some embodiments, non-SOI based MEMS devices may use the conductive element 16 to electrically connect various portions of their respective top layers.

Accordingly, in addition to electrically communicating isolated portions of the device layer 32, illustrative embodiments also pre-form the device layer 32 with the conductive pathway. Consequently, there is no need to etch through the device layer 32 to contact the internally located conductive element 16 because the conductive path is pre-formed. Complex alignment processes that attempt to precisely align the internal conductive element 16 with the subsequently formed conductive paths 24 and 30 thus are not necessary. Elimination of these alignment processes improves production volume while saving manufacturing costs.

Although various exemplary embodiments of the invention are disclosed below, it should be apparent to those skilled in the art that various changes and modifications can be made that will achieve some of the advantages of the invention without departing from the true scope of the invention.

What is claimed is:

1. A method of forming a MEMS device, the method comprising:
   producing a device layer wafer, wherein producing comprises:
      providing a material layer;
      coupling a conductor to the material layer; and
      forming at least one conductive path through at least a portion of the material layer to the conductor;
   providing a handle wafer; and
   after the conductive path is formed, coupling the produced device layer wafer to the handle wafer, the conductor being contained between the material layer and the handle wafer.

2. The method as defined by claim 1 wherein the material layer has an exposed top surface, at least one conductive path extending to the exposed top surface.

3. The method as defined by claim 1 further comprising removing a portion of the material layer to substantially expose the at least one conductive path.

4. The method as defined by claim 1 wherein the material layer has an exposed top surface, the method further comprising oxidizing the exposed top surface to optically distinguish the material layer from the conductive path.

5. The method as defined by claim 1 further comprising applying an insulator between the material layer and the conductor, the insulator coupling the conductor to the material layer.

6. The method as defined by claim 1 wherein the conductor is formed from a first semiconductor material and the material layer is formed from a second semiconductor material.

7. The method as defined by claim 1 wherein the at least one conductive paths is an anchor.

8. The product formed by the method defined by claim 1.

9. A method of forming a device layer wafer of a MEMS device, the method comprising:
   providing a material layer having a top surface;
   forming a conductive pathway through at least a portion of the material layer, the conductive pathway having at least one end substantially at the top surface; and
   oxidizing the top surface of the material layer to optically distinguish the end of the conductive pathway from the material layer.

10. The method as defined by claim 9 further comprising removing a portion of the material layer to form the top surface.

11. The method as defined by claim 9 wherein forming comprises:
   coupling a conductor to the material layer; and
   forming at least one conductive path through at least a portion of the material layer to the conductor, the at least one conductive path and conductor forming the conductive pathway.

12. The method as defined by claim 9 wherein oxidizing causes the end to extend outwardly from the top surface of the material layer.

13. The method as defined by claim 9 wherein oxidizing causes the end to have a first color and the top surface of the material layer to have a second color, the first and second colors being different.

14. The method as defined by claim 9 wherein the material layer is formed from a first material and the conductive pathway is formed from a second material, the first material being different from the second material.

15. The product formed by the method defined by claim 9.

* * * * *